United States Patent
Bi et al.

(10) Patent No.: US 6,630,820 B2
(45) Date of Patent: Oct. 7, 2003

(54) METHOD AND APPARATUS FOR MEASURING THE INSTANTANEOUS FREQUENCY OF FM SIGNALS

(75) Inventors: Mi Michael Bi, Singapore (SG); Peter Kwong Ming Kiew, Hurtsville (AU); Chin Hon Ng, Singapore (SG)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/263,076

(22) Filed: Oct. 3, 2002

(65) Prior Publication Data

US 2003/0052662 A1 Mar. 20, 2003

Related U.S. Application Data

(62) Division of application No. 09/580,567, filed on May 30, 2000, now Pat. No. 6,483,286.

(30) Foreign Application Priority Data

May 31, 1999 (JP) .................... 11-151992

(51) Int. Cl.$^7$ .............. G01R 23/02; G01R 13/34; G01R 23/165; H03D 3/00; G06F 19/00
(52) U.S. Cl. .............. 324/76.39; 324/76.38; 324/76.29; 329/341; 702/75; 702/190
(58) Field of Search .......... 324/76.39, 76.38, 324/76.44, 76.24, 76.29, 118; 702/75, 76, 79, 189, 190; 329/317, 336, 341, 313; 703/2

(56) References Cited

U.S. PATENT DOCUMENTS

| | | | | |
|---|---|---|---|---|
| 4,037,151 A | * | 7/1977 | Takeuchi | 324/76.33 |
| 4,547,737 A | * | 10/1985 | Gibson | 329/343 |
| 4,866,260 A | * | 9/1989 | Lescourret | 324/76.28 |
| 5,373,236 A | | 12/1994 | Tsui et al. | 324/76.42 |
| 5,444,416 A | * | 8/1995 | Ishikawa et al. | 329/341 |

\* cited by examiner

Primary Examiner—Anjan K. Deb
(74) Attorney, Agent, or Firm—Greenblum & Bernstein, P.L.C.

(57) ABSTRACT

A method and an apparatus for measuring the instantaneous frequency of FM modulated signals, includes sampling, instantaneous frequency computing, and lowpass filtering. FM modulated signal are sampled at prescribed intervals to provide digitized FM signal. The instantaneous frequency is computed by manipulating the digitized FM signal mathematically using a new mathematical equation proposed in this invention to provide the instantaneous frequency based on digitized FM signal samples. More accurate instantaneous frequency values can be obtained by filtering the computed instantaneous frequency values using a lowpass filter.

12 Claims, 2 Drawing Sheets

METHOD AND APPARATUS FOR MEASURING THE INSTANTANEOUS FREQUENCY OF FM SIGNALS

This application is a division of U.S. patent application Ser. No. 09/580,567, filed on May 30, 2000, now U.S. Pat. No. 6,483,286 B1 issued on Nov. 19, 2002 the contents of which is incorporated herein in its entirety.

BACKGROUND OF THE INVENTION

1. Field of the Invention

The invention is applicable to the implementation of digital demodulation of analog frequency modulated signal in which the frequency of the modulating signal is relatively small compared to the sampling frequency. A typical application of this invention is demodulation of the frequency modulated TV sound sampled at high frequency.

2. Description of the Prior Art

An FM modulated signal y(t) can be expressed as:

$$y(t) = A\sin[\psi(t)] = A\sin[2\pi f_c t + \phi(t)]$$

where A is the amplitude of the modulated signal, $f_c$ is the carrier frequency and $\phi(t)$ is a function of the baseband (modulating) signal m(t) as follows $$\phi(t) = k \int_{-\infty}^{t} m(t)dt$$

where k is the modulation constant. The instantaneous frequency f(t) of the modulated signal y(t) is a linear function of m(t) as follows $$f(t) = \frac{1}{2\pi}\frac{d\psi(t)}{dt} = f_c + \frac{k}{2\pi}m(t)$$

The FM demodulation is to recover m(t) from the FM modulated signal y(t). There are several methods to demodulate an analog FM modulated signal using digital techniques. The arc tangent FM demodulation method (see "Demodulator of sampled data FM signals from sets of four successive samples", by J. J. Gibson, U.S. Pat. No. 4,547,737, and "Digital Frequency discriminator", by F. G. A. Goupe, Electronics Letters, vol. 15, no. 16, August 1979) uses the Hilbert transform to decompose the carrier into two signals a(t) and b(t) which are orthogonal to each other, i.e.

$$y(t) = a(t) + jb(t)$$

Thus, the baseband signal m(t) can be obtained by $$m(t) = \alpha \frac{d\{\tan^{-1}[b(t)/a(t)]\}}{dt}$$

where a is a constant. Another method is proposed based on an arc cosine system (see "Digital FM demodulation apparatus demodulating sampled digital FM modulated wave" by Y. Ishikawa and S. Nomura, U.S. Pat. No. 5,444,416). In this arc cosine FM demodulation method, the FM modulated signal is first sampled at a sampling interval T. Consecutive samples $y_{t-T}$, $y_t$ and $y_{t+T}$ at time t−T, t and t+T can be expressed as follows:

$$y_{t-T} = A\sin[2\pi f(t-T) + \theta]$$
$$y_t = A\sin[2\pi f t + \theta]$$
$$y_{t-T} = A\sin[2\pi f(t+T) + \theta]$$

where A, f and θ are an amplitude, an instantaneous frequency and an initial phase of $y_t$, respectively. It has been proved that the instantaneous frequency f at time t is given by:

$$f = \frac{1}{2\pi T}\cos^{-1}\left(\frac{y_{t-T} + y_{t+T}}{2y_t}\right)$$

Once the instantaneous frequency of a FM modulated i signal is obtained, the demodulated signal can be obtained from the instantaneous frequency using a linear equation.

As described above, Hilbert transform is used in the arc tangent digital demodulation method is a phase circuit employing the Hilbert transform. The required circuit is large and the computation process introduces long delay. In order to avoid this problem, the sampling frequency must be carefully chosen to be four times the carrier frequency rate. This is not practical. Firstly, different FM systems use different carrier frequencies. The demodulation system will be too complex if multiple frequencies are introduced. Secondly, the sampling frequency is sometimes restricted by requirements of other modules of an FM demodulation and signal processing system. The arc cosine digital FM demodulation method is simpler than the arc tangent FM digital demodulation system. However, there is still an inconvenient division operation involved in the procedure for computing the instantaneous frequency. This is not practical in hardware implementation since the values of $y_t$ are sometimes close or equal to zero. Thus, special processing is needed to prevent the demodulation system from overflow if this situation happens.

SUMMARY OF THE INVENTION

The problem to be solved by this invention is to develop a simple method for digital FM demodulation having less complexity than the methods described in the prior art.

The new method of calculating the instantaneous frequency based on the sampled values is described as follows. Assume that an FM modulated signal is sampled at a sampling interval of T. If the sampling frequency is high enough, we can assume that the instantaneous frequency values at time t−T, t and t+T are approximately the same, i.e.

$$f_{t-T} \approx f_t \approx f_{t+T}$$

Hence, three consecutive samples $y_{t-T}$, $y_{t-T}$ and $y_{t-T}$ at time t−T, t and t+T can be respectively expressed as follows:

$$y_{t-T} = A\sin[2\pi f_t(t-T) + \theta]$$
$$y_t = A\sin[2\pi f_t t + \theta]$$
$$y_{t-T} = A\sin[2\pi f_t(t+T) + \theta]$$

Let $\phi = 2\pi f_t t + \theta$ and $\phi_0 = 2\pi f_t T$, we have $$y_{t-T} = A\sin(\varphi - \varphi_0)$$
$$y_t = A\sin\varphi$$
$$y_{t-T} = A\sin(\varphi + \varphi_0)$$

Since $$y_{t-T}y_{t+T} = A^2\sin(\varphi - \varphi_0)\sin(\varphi + \varphi_0) = \frac{A^2}{2}[\cos(2\varphi_0) - \cos(2\varphi)]$$

and $$\cos(2\varphi) = 1 - 2\sin^2\varphi = 1 - \frac{2}{A^2}y_t^2$$

Therefore $$\cos(2\varphi_0) = \frac{2}{A^2}(y_{t-T}y_{t+T} - y_t^2) + 1$$

Thus, the instantaneous frequency value at time t can be computed by the following equation:

$$f_t = \frac{1}{4\pi T}\cos^{-1}\left[\frac{2}{A^2}(y_{t-T}y_{t+T} - y_t^2) + 1\right]$$

Based on the equations described here, an apparatus is set up for measuring instantaneous frequency of FM-modulated signal. Said apparatus comprises a sampling means, an instantaneous frequency computing means and a lowpass filtering means. Said instantaneous frequency computing means further comprises two delay means, a multiplier, a square means, a bit-shifting means, a subtracting means, a scaling means, an adding means and an inverse cosine computing means.

The description will now be made on the operation of the apparatus invented for digital FM demodulation. Said sampling means samples the input analog FM modulated signal at a prescribed sampling interval T to obtain three consecutive samples $Y_{t-T}$, $y_t$ and $y_{t+T}$ at times t−T, t and t+T, respectively. Said signal instantaneous frequency computing means computes said instantaneous frequency $f_t$ at time t based on an equation $$f_t = \frac{1}{4\pi T}\cos^{-1}(s_t),$$

where $$s_t = \frac{2}{A^2}(y_{t-T}y_{t+t} - y_t^2) + 1$$

and A is the amplitude of an FM modulated signal. The instantaneous frequency is then filtered by said lowpass filter to reduce the noise introduced by said data sampling means and said instantaneous frequency computing means.

The operations of said instantaneous frequency computing means are now explained. The first delay means receives the digitized FM signal and delays said digitized FM signal by one prescribed interval to provide a first delayed FM signal. The second delay means receives said first delayed FM signal and further delays said first delayed FM signal by said prescribed interval to provide a second delayed FM signal. The square means receives said first delayed signal and computes the squared values of said first delayed FM signals. The multiplier computes the product values of digitized FM signal and said second delayed FM signal. Said squared values are subtracted from said product values to provide the difference signal. Each value of said difference signal is left-shifted by one bit to the left by said bit-shifting means to obtain bit-shifted signal. The scaled signal is then obtained by scaling said bit-shifted signal by the factor $A^2$, where A is the amplitude of the FM signal. The adding means increments each value of said scaled signal by one to obtain said incremented signal. The instantaneous frequency is computed by said inverse cosine computing means based on said incremented signal.

BRIEF DESCRIPTION OF THE DRAWINGS

These and other objects and features of the present invention will become clear from the following description taken in conjunction with the preferred embodiment thereof and the accompanying drawings throughout which like parts are designated by like reference numerals, and in which.

DETAILED DESCRIPTION OF THE PREFERRED EMBODIMENTS

Figure 1:
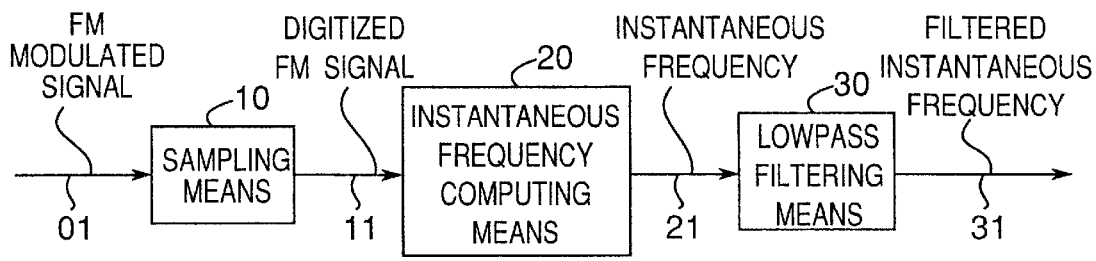
FIG. 1 is a block diagram of a first embodiment for measuring the instantaneous frequency of FM modulated signal according to the present invention.

An embodiment of this invention is shown in FIG. 1. This apparatus is used to measure the instantaneous frequency of an FM modulated signal with an normalized amplitude. It comprises a sampling means (10), an instantaneous frequency computing means (20) and a lowpass filtering means (30).

The analog FM modulated signal (01) is first sampled by the sampling means (10) at a prescribed interval to generate a digitized FM signal (11). The instantaneous frequency (21) is computed by the instantaneous frequency computing means (20) based on the digitized FM signal (11). The instantaneous frequency (21) is finally filtered by the lowpass filtering means (30) to obtain filtered instantaneous frequency (31).

Figure 2:
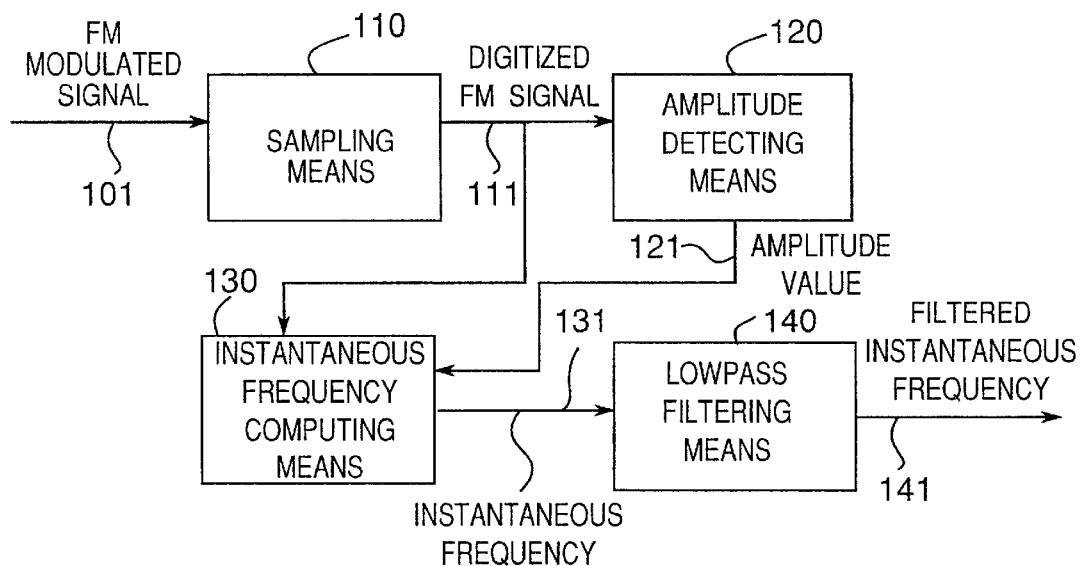
FIG. 2 is a block diagram of a second embodiment for measuring the instantaneous frequency of FM modulated signal according to the present invention.

Another embodiment shown in FIG. 2 is similar to the embodiment shown in FIG. 1. This apparatus is used to measure the instantaneous frequency of an FM modulated signal with an amplitude of arbitrary value. It is noted that an amplitude detecting means (120) is introduced to improve the accuracy of instantaneous frequency measurement.

The analog FM modulated signal (101) is first sampled by the sampling means (110) at a prescribed interval to generate a digitized FM signal (111). The amplitude detecting means (120) receives the digitized FM signal (111) and detects the amplitude of the digitized FM signal (111). The amplitude value (121) obtained by the amplitude detecting means (120) is provided to the instantaneous frequency computing means (130). The instantaneous frequency (131) is computed by the instantaneous frequency computing means (130) based on the digitized FM signal (111) and the amplitude value (121). The instantaneous frequency (131) is then filtered by the lowpass filtering means (140) to obtain the filtered instantaneous frequency (141).

The effect of the embodiments shown in FIGS. 1 and 2 is that the instantaneous frequency of an analog FM-modulated signal can be measured digitally. This means the FM demodulating process can be implemented using a digital circuit. Compared to the analog FM demodulation methods in which the demodulation error is large due to the aging and ambient conditions of the circuit elements, the digital FM demodulation circuit implemented using the architecture shown in FIG. 1 or 2 is more accurate and stable. Since the amplitude of the FM signals may be distorted after digitization, the amplitude detecting means shown in FIG. 2 can further improve the accuracy of instantaneous frequency computation.

Figure 3:
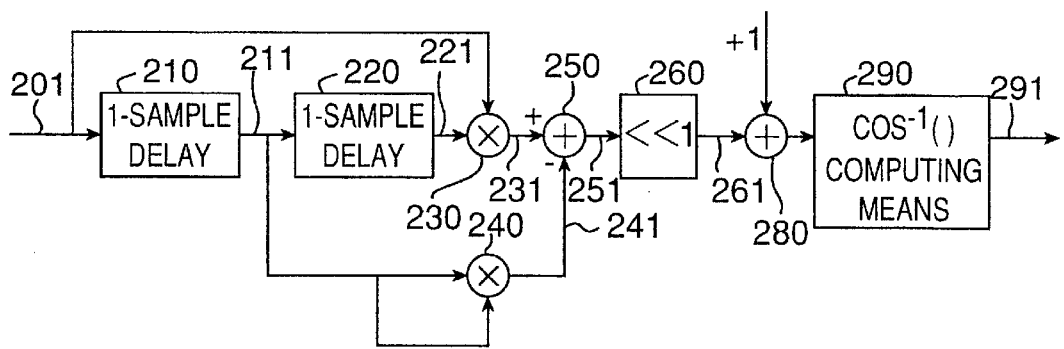
FIG. 3 is a block diagram of the instantaneous frequency computing means according to the first embodiment.

Another embodiment shown in FIG. 3 explains the realization of the instantaneous frequency computation means (20, 130) illustrated in FIGS. 1 and 2, respectively. It comprises two delay means (210 and 220), a multiplier (230), a square means (240), a subtracting means (250), a bit-shifting means (260), an adding means (280) and an inverse cosine computing means (280).

The operation of this embodiment is now explained. The digitized FM signal is delayed by the first delay means (210) to generate a first delayed FM signal (211). The first delayed FM signal (211) is then delayed by the second delay means to generate a second delayed FM signal (221). The first delayed FM signal (211) is squared by the square means to obtain a squared signal (241). The multiplier (230) receives the digitized FM signal (201) and the second delayed FM signal (221) and computes the product of the two received signals to generate a multiplied signal (231). The subtracting means subtracts the squared signal (241) from the multiplied signal (231) to generate a difference signal (251). The difference signal is shifted one bit to the left by the bit-shifting means (260) to generate a bit-shifted signal (261). The adding means (280) increments the bit-shifted signal (261) by 1 to generate incremented signal (281). The output of the adding means (280) is then input to the inverse cosine computing means (290) to obtain the instantaneous frequency $f_t$ at time t (291) using the equation $$f_t = \frac{1}{4\pi T}\cos^{-1}(a_t),$$

where T is the prescribed sampling interval and $a_t$ is the incremented signal at time t.

Figure 4:
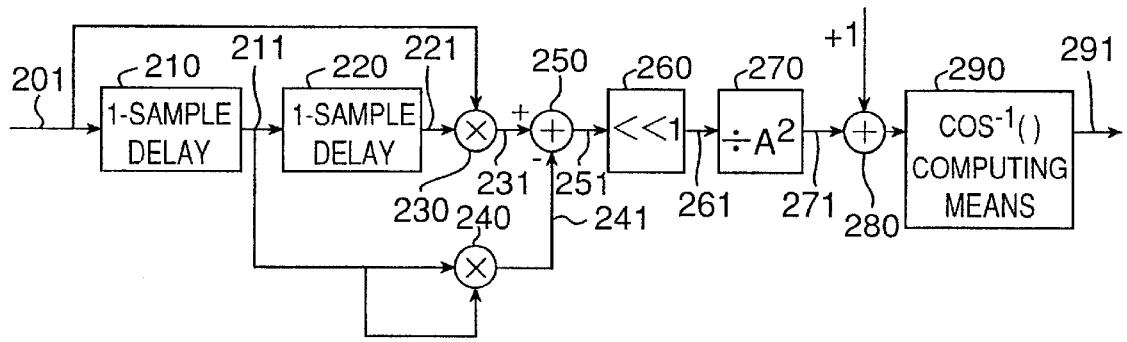
FIG. 4 is a block diagram of the instantaneous frequency computing means according to the second embodiment.

The embodiment shown in FIG. 4 is similar to that shown in FIG. 3 except that it has a scaling means receiving the bit-shifted signal (261) and providing a scaled signal (271). The scaling means (270) divides the bit-shifted signal (261) by the square of the amplitude of the FM signal ($A^2$) obtained by the amplitude detecting means (120) to generate a scaled signal (271). The instantaneous frequency $f_t$ at time t (291) can be computed by the inverse cosine computing means (290) based on the equation $$f_t = \frac{1}{4\pi T}\cos^{-1}(s_t),$$

where T is the prescribed sampling interval and $s_t$ is the incremented signal at time t.

The effect of the embodiment shown in FIG. 3 is that the instantaneous frequency computation can be simply implemented using an adder, a subtracter and two multipliers. Compared to the arc cosine FM demodulation method described in the prior art where a divider is required for frequency specification, the scale of the circuit is much smaller. This apparatus works well if the amplitude tolerance of the analog-to-digital converter (ADC) is small. However, if the amplitude tolerance of the ADC is large, the apparatus shown in FIG. 4 gives more precise measurement of the instantaneous frequency. Moreover, the problem of data overflow due to the small divisor in the frequency specification equation for arc cosine FM demodulation method described in the prior art is avoided for both apparatus shown in FIGS. 3 and 4.

This invention provides a simple and efficient method and apparatus for measuring the instantaneous frequency of the FM modulated signals. The processing of FM demodulation can thus be performed in the digital domain so that the problem of system instability encountered in the analog FM demodulation is avoided. The computational requirement of this invention is less intensive than that required for the conventional instantaneous frequency measurement methods used for digital demodulation of FM signals. Also, the data overflow problem encountered in the arc cosine FM demodulation method described in the prior art is avoided in this invention. The instantaneous frequency of the FM modulated signal obtained using the method and apparatus presented in this invention is accurate if the sampling frequency is high.

The present disclosure relates to subject matter contained in priority Japanese Patent Application No. HEI 11-151992, filed on May 31, 1999, the contents of which is herein expressly incorporated by reference in its entirety.

What is claimed:

1. An apparatus for measuring an instantaneous frequency of an FM-modulated signal having a normalized amplitude, the apparatus comprising:

a sampler that receives an analog FM modulated signal, said sampler sampling the analog FM modulated signal at a prescribed sampling interval T and providing a digitized FM signal corresponding to a time t; and an instantaneous frequency computer that receives the digitized FM signal, said instantaneous frequency computer manipulating the digitized FM signal by performing mathematical operations, without performing a division operation, based on the digitized FM signal and a plurality of additional digitized FM signals corresponding to sampling intervals at times other than time t, and providing the instantaneous frequency.

2. The apparatus for measuring the instantaneous frequency according to claim 1, wherein:

said sampler samples the analog FM modulated signal at the prescribed sampling interval T to obtain sample values $y_{t-T}$, $y_t$, and $y_{t+T}$ at times t–T, t, and t+T, respectively; and said instantaneous frequency computer computes the instantaneous frequency at the time t based on the following equation:

$$f_t = (1/4\pi T)\cos^{-1}(2y_{t-T}y_{t+T} - 2y_t^2 + 1).$$

3. The apparatus for measuring the instantaneous frequency according to claim 1, wherein said instantaneous frequency computer comprises:

a first delay that receives the digitized FM signal and delays the digitized FM signal by the prescribed sampling interval to provide a first delayed FM signal;

a second delay that receives the first delayed FM signal and delays the first delayed FM signal by the prescribed sampling interval to provide a second delayed FM signal;

a first multiplier, having a first input terminal and a second input terminal coupled to an output of said first delay;

a second multiplier, having a first input terminal coupled to an output terminal of said second delay and a second input terminal coupled to an output terminal of said sampler;

a subtracter, having a first input terminal coupled to said first multiplier and a second input terminal coupled to said second multiplier, said subtracter subtracting data received at its first input terminal from data received at its second input terminal to provide a difference signal;

a bit-shifter that receives the difference signal and left-shifts the difference signal by one bit;

an adder that receives the bit-shifted signal and increments the bit-shifted signal by one to obtain an incremented signal at the time t, based on the following equation:

$$s_t = 2y_{t-T}y_{t+T} - 2y_t^2 + 1$$

where said sampler samples the analog FM modulated signal at the prescribed sampling interval T to obtain sample values $y_{t-T}$, $y_t$, and $y_{t+T}$ at times t−T, t, and t+T, respectively; and an inverse cosine computer that receives the incremented signal and computes the instantaneous frequency at the time t based on the following equation:

$$f_t = (1/4\pi T)\cos^{-1}(s_t)$$

where $s_t$ is the previously calculated incremented signal at the time t.

4. The apparatus for measuring the instantaneous frequency according to claim 1, further comprising a lowpass filter that receives the instantaneous frequency and provides a filtered instantaneous frequency, said lowpass filter selecting a cut-off frequency based on a bandwidth of a base band signal.

5. A method for measuring an instantaneous frequency of an FM-modulated signal having an arbitrary amplitude value, the method comprising:

sampling an analog FM modulated signal at a prescribed sampling interval T to provide a digitized FM signal at a time t; and computing the instantaneous frequency by performing mathematical operations, without performing a division operation, based on the digitized FM signal and a plurality of additional digitized FM signals, corresponding to alternative sampling intervals.

6. The method for measuring the instantaneous frequency according to claim 5, the sampling of the analog FM modulated signal comprising sampling at the prescribed sampling interval T and obtaining sample values $y_{t-T}$, $y_t$, and $y_{t+T}$ at times t−T, t, and t+T, respectively; and the computing of the instantaneous frequency at the time t comprising computing based on following equation:

$$f_t = (1/4\pi T)\cos^{-1}(2y_{t-T}y_{t+T} - 2y_t^2 + 1).$$

7. The method for measuring the instantaneous frequency according to claim 5, the computing of the instantaneous frequency comprising:

delaying the digitized FM signal by the prescribed sampling interval to provide a first delayed FM signal;

delaying the first delayed FM signal by the prescribed sampling interval to provide a second delayed FM signal;

multiplying the digitized FM signal and the second delayed FM signal to obtain a multiplied signal;

squaring the first delayed FM signal to obtain a squared signal;

subtracting the squared signal from the multiplied signal to obtain a difference signal;

shifting the difference signal by one bit to obtain a bit-shifted signal;

incrementing the bit-shifted signal by one to obtain an incremented signal; and computing the instantaneous frequency based on the incremented signal.

8. The method for measuring the instantaneous frequency according to claim 5, further comprising filtering the instantaneous frequency by a lowpass filter and selecting a cut-off frequency based on a bandwidth of a base band signal.

9. A method for measuring an instantaneous frequency of an FM-modulated signal having an arbitrary amplitude value, the method comprising:

sampling an analog FM modulated signal at a prescribed sampling interval T to provide a digitized FM signal;

detecting an amplitude of the digitized FM signal and providing an amplitude value A; and computing an instantaneous frequency of the FM modulated signal by performing mathematical operations based on the amplitude value, the digitized FM signal and a plurality of additional digitized FM signals, corresponding to alternative sampling intervals.

10. The method for measuring the instantaneous frequency according to claim 9, the sampling of the analog FM modulated signal comprising sampling at the prescribed sampling interval T and obtaining sample values $y_{t-T}$, $y_t$, and $y_{t+T}$ at times t−T, t, and t+T, respectively; and the computing of the instantaneous frequency at the time t comprising computing based on the following equation:

$$f_t = (1/4\pi T)\cos^{-1}\{(2/A^2)(y_{t-T}y_{t+T} - y_t^2) + 1\}.$$

11. The method for measuring the instantaneous frequency according to claim 9, the computing of the instantaneous frequency comprising:

delaying the digitized FM signal by the prescribed sampling interval to provide a first delayed FM signal;

delaying the first delayed FM signal by the prescribed sampling interval to provide a second delayed FM signal;

multiplying the digitized FM signal and the second delayed FM signal to obtain a multiplied signal:

squaring the first delayed FM signal to obtain a squared signal;

subtracting the squared signal from the multiplied signal to obtain a difference signal;

shifting the difference signal by one bit to obtain a bit-shifted signal;

dividing the bit-shifted signal by a square of the amplitude value A to obtain a scaled signal;

incrementing the scaled signal by one to obtain an incremented signal; and computing the instantaneous frequency based on the incremented signal.

12. The method for measuring the instantaneous frequency according to claim 9, further comprising filtering the instantaneous frequency by a lowpass filter and selecting a cut-off frequency based on a bandwidth of a base band signal.

* * * * *

UNITED STATES PATENT AND TRADEMARK OFFICE
CERTIFICATE OF CORRECTION

PATENT NO. : 6,630,820 B2
DATED : October 7, 2003
INVENTOR(S) : M. Bi et al.

It is certified that error appears in the above-identified patent and that said Letters Patent is hereby corrected as shown below:

<u>Column 7,</u>
Lines 29-30, "an arbitrary amplitude value" should read -- a normalized amplitude --.

Signed and Sealed this

Thirteenth Day of April, 2004

JON W. DUDAS
*Acting Director of the United States Patent and Trademark Office*